Figure 1:
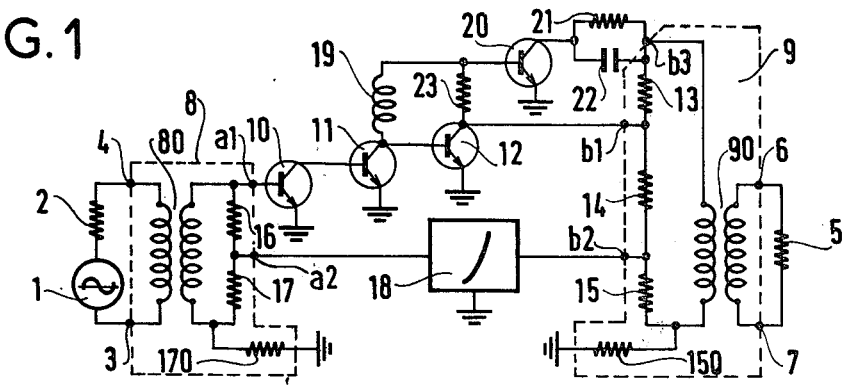

United States Patent [19]

Lafon

[11] 4,263,564
[45] Apr. 21, 1981

[54] WIDE-BAND TRANSISTORIZED AMPLIFIER

[75] Inventor: Jean-Luc Lafon, Le Perreux sur Marne, France

[73] Assignee: Compagnie Industrielle des Telecommunications Cit-Alcatel, Paris, France

[21] Appl. No.: 22,200

[22] Filed: Mar. 20, 1979

[51] Int. Cl.³ .......................... H03F 1/08; H03F 3/19
[52] U.S. Cl. .................................... 330/293; 330/141; 330/151
[58] Field of Search ................. 330/149, 151, 293, 310

[56] References Cited

U.S. PATENT DOCUMENTS 3,810,256   5/1974   Van Doorn ..................... 330/149 X

*Primary Examiner*—James B. Mullins
*Attorney, Agent, or Firm*—Roland Plottel

[57] ABSTRACT

A wide-band transistorized amplifier including between two line couplers a cascade of stages of amplification and a negative feed-back quadripole connecting the output from the last stage of the cascade to the input to the first, and including a stage of correction by forward gain control, which is arranged in parallel across one of the stages of the cascade, which is connected to one of the couplers, characterized by the fact that the stage (10, 12) of the cascade, across which the correction stage is arranged in parallel, introduces a phase reversal, and that the correction stage includes a CE transistor (20, 20', 20'') the base of which is connected on the one hand through an inductive phase-shift impedance (19, 19', 19'') to the input to the said stage (10, 12) of the cascade, and on the other hand through a resistor (23, 23', 23'') to the output from the said stage of the cascade, and the collector of which is connected through the putting in parallel of a resistor (21, 21', 21'') and a capacitor (22, 22', 22'') to the output from the said stage of the cascade, so that the wanted signal is substantially cancelled at the input to the transistor of the correction stage, and that the noises generated by the said stage of the cascade, which are amplified by this correction stage, are substantially reduced at the level of a load (5) connected to the output from the amplifier.

3 Claims, 4 Drawing Figures

WIDE-BAND TRANSISTORIZED AMPLIFIER

The invention refers to a wide-band transistorized amplifier which may be employed, for example, as a line amplifier on a coaxial cable of a capacity of about 10,000 telephone channels, the maximum transmitted frequency of which is of the order of 60 MHz.

It is known that a wide-band transistorized amplifier usually includes two linecouplers interconnected by a cascade of transistors with a negative-feedback, two-port network connecting the output from the last transistor of the cascade to the input to the first thereby determing the gain of the amplifier as a function of frequency according to a given law.

The practice is likewise known of equipping such an amplifier with a distortion noise corrector using a "feed-forward" system. Such a system is described, for example, in the periodical IEEE Com 19, 1971 no. 3 "A feed-forward experiment applied to an L-4 carrier system amplifier". Preferred embodiments of the present invention improve such an amplifier by limiting the non-linearity distortions and reducing the noise factor. Such an amplifier could then be employed for a wider band of frequencies.

The present invention provides a wide-band transistorized amplifier including two line couplers interconnected by a cascade of amplification stages and a negative-feedback two-port network connecting the output from the last stage of the cascade to the input to the first, and including a transistorized feed-forward correction stage connected in parallel across one of the end stages of the cascade i.e. one which is connected to one of the line couplers, wherein the cascade stage across which the correction stage is connected in parallel introduces a phase inversion, and wherein the correction stage includes a common-emitter connected transistor whose base is connected to the input to the said end stage of the cascade via an inductive phase-shift impedance and also to the output from the said end stage of the cascade via a resistor, the collector of said transistor of the correction stage being connected to one terminal of the output coupler via a parallel-connected resistor and capacitor, so that the wanted signal is cancelled at the input to the transistor of the correction stage and so that the non-linear products generated by the last stage of the cascade, which constitutes the only signal amplified by the correction stage, are cancelled at the level of a load connected to the output of the amplifier.

Preferably the coupler to which the correction stage is connected includes one more port on the amplifier side than does the other coupler, in order to enable the correction stage and the amplification stage of the cascade across which the correction stage is arranged in parallel, to be connected into two different ports of the coupler concerned. In a first case in which the couplers include chains of resistors on the amplifier side, this extra port is obtained by including an extra resistor in the chain of the coupler concerned. In a second case in which the couplers are equipped on the amplifier side which a number of transformer windings, this extra port is obtained by an extra winding in the coupler concerned.

In a particular embodiment of the invention the correction stage is arranged in parallel across the last amplification stage of the cascade. The non-linearity distortion is thus reduced effectively. In the case in which the last stage of the cascade introduces a phase inversion, the correction stage then preferably includes a common emitter connected transistor whose base is connected firstly to the base of the last transistor of the cascade via an inductive phase-shift impedance and secondly to the collector of the last transistor of the cascade via a resistor. The collector of the said common emitter connected transistor to one terminal of the output coupler via a parallel connection of a resistor and a capacitor so that the wanted amplification signal is cancelled at the input to the transistor of the correction stage and that the non-linear products which alone are amplified by this stage, are cancelled at the output to the load.

In a variant the correction stage is arranged in parallel across the first amplification stage of the cascade. The noise factor of the amplifier is then effectively reduced.

Figure 2:
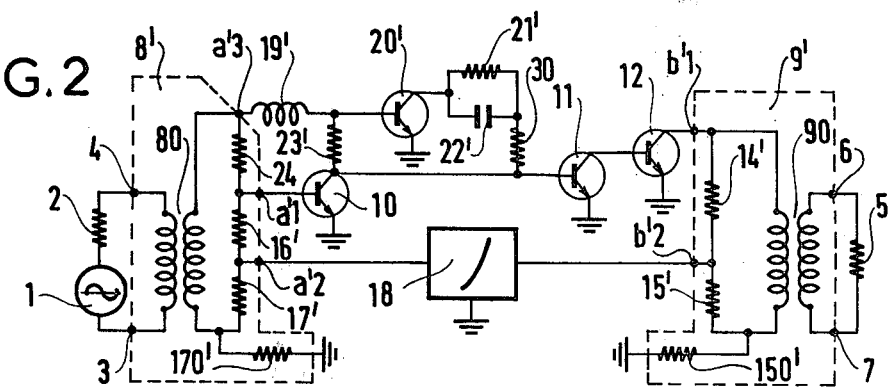
Figure 3:
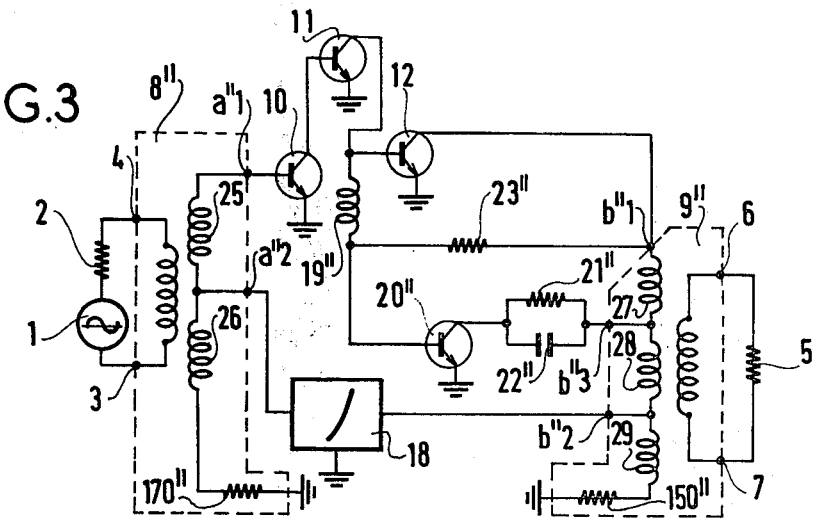
Figure 4:
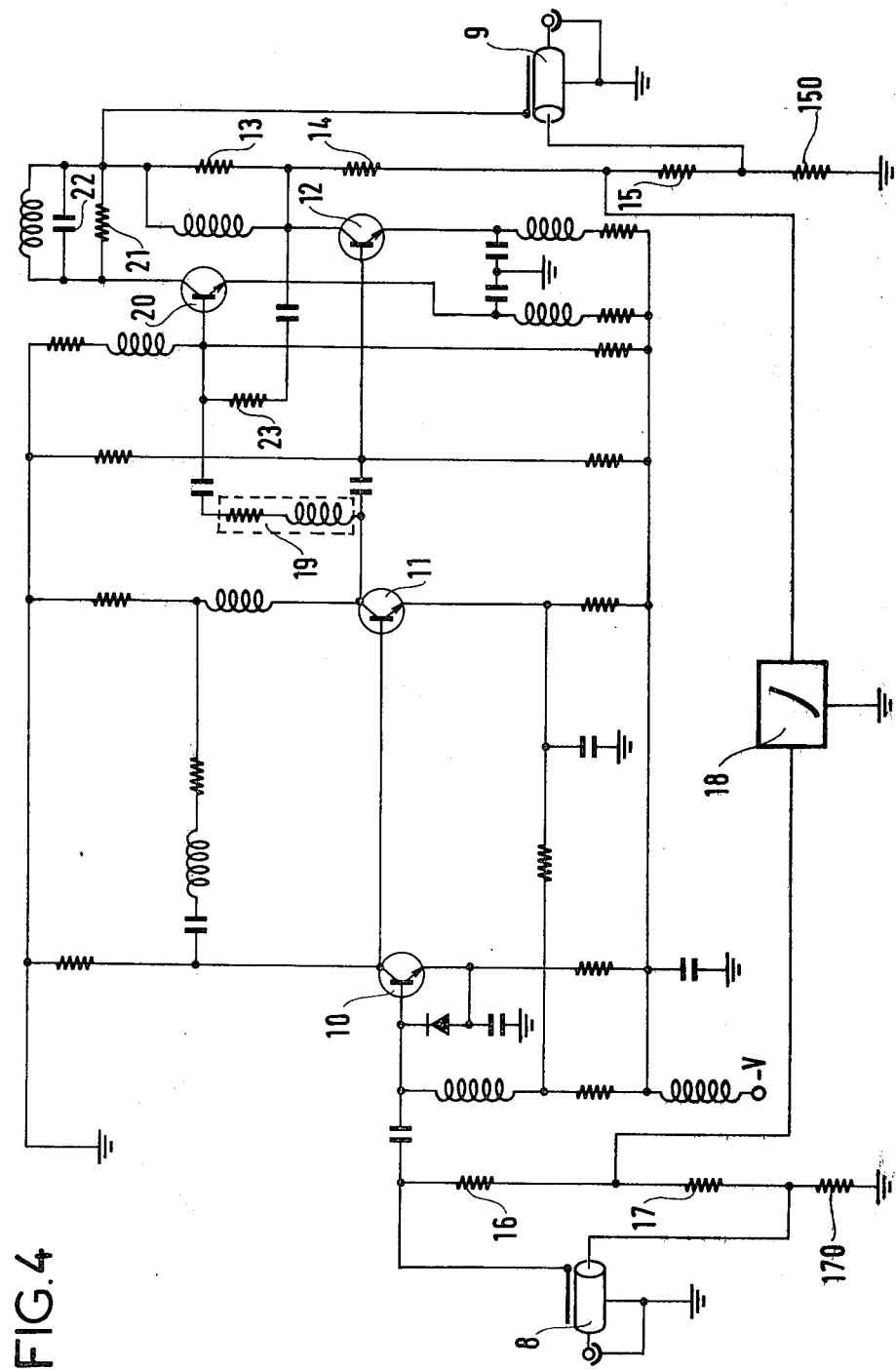

Three embodiments of the invention are described below in greater detail with reference to the accompanying drawings in which:

FIGS. 1 to 3 are the AC circuit diagrams of three respective variants of the invention; and FIG. 4 is a complete circuit diagram of the variant of FIG. 1.

Referring to FIG. 1, a signal source 1, has its internal resistance symbolized by a resistor 2 and is applied to a line amplifier via terminals 3 and 4. The amplifier delivers its output signal to a load 5 via output terminals 6 and 7. Of course, this amplifier may be one of the amplifiers of a coaxial cable link which is remotely powered from the ends of the cable.

The amplifier shown is equipped with an input coupler 8 and an output coupler 9. The input coupler 8 is connected to the source via the terminals 3 and 4 and comprises conventionally a transformer 80, two resistors 16 and 17 connected in series with the winding on the amplifier side of a transformer 80 and a balancing resistor 170 connected between amplifier ground and the point common to the winding on the amplifier side of the transformer 80 and to the resistor 17.

The output coupler 9 is connected to the load via the output terminal 6 and 7, and likewise comprises a transformer 90, three resistors 13, 14 and 15 connected in series with the winding on the amplifier side of the transformer 90, and a balancing resistor 150 connected between amplifier ground and the point common to the winding on the amplifier side of the transformer 90 and to the resistor 15. Three resistors 13, 14, 15, are used at the output side instead of two thereby providing one more port than there is at the input coupler. As we shall see later, this extra port is employed for feed-forward.

The amplifier includes a plurality of amplification stages cascaded between the couplers 8 and 9. In FIG. 1 the plurality is equal to three and each stage is formed by a respective one of the transistors 10, 11 and 12. These transistors are connected in common-emitter mode with their respective emitters connected to amplifier ground. The base of the first transistor 10 of the cascade, is connected to a first port a1 of the input coupler 8 (the point common to the winding on the amplifier side of the transformer 80 and to the resistor 16), and the collector of the last transistor 12 of the cascade, is connected to a first port b1 of the output coupler 9 (the point common to the resistors 13 and 14). A negative-feedback, two-port network 18 connects a second port b2 of the output coupler 9 (the point common to the resistors 14 and 15) to a second port a2 of the input coupler 8 (the point common to the resistors 16 and 17). This feed-back network 18 may comprise a simple impedance, but often it is a complicated structure used to define a particular desired response curve of the amplifier as a function of frequency.

It should be observed that the circuit diagram of FIG. 1 is an AC circuit diagram only in order to emphasise the main points of the invention better than the complete circuit diagram. The invention is realised in the embodiment illustrated by FIG. 1, by a feed-forward correction stage, including an inductive phase-shift impedance 19 followed by a correction transistor 20 connected in common emitter mode with its emitter connected to amplifier ground. The inductive phase-shift impedance is connected between the base of the last transistor 12 of the cascade and the base of the correction transistor 20. The collector of this transistor is connected via a parallel-connected resistor 21 and capacitor 22 to a third port b3 of the output coupler 9 (the point common to the winding on the amplifier side of the transformer 90 and to the resistor 13).

The output signal on the collector of the last transistor 12 of the cascade is attenuated by a resistor 23 which is connected between the collector of this transistor and the base of the correction transistor 20. By suitable choices for the value of the resistor 23 and for the value of the inductive phase-shift impedance 19 it is possible to arrange at the base of the transistor 20 that the components of the wanted signals proceeding from the collector of the transistor 11 and from the collector of the transistor 12 are substantially equal in amplitude and in phase opposition, the main role of the inductive impedance 19 being to correct the imperfections in phase opposition provided by the transistor 12. On that account the signal appearing on the base of the correction transistor 20 is essentially due to the non-linear products generated in the transistor 12. This error signal is then applied to the load 5 with a phase and amplitude adjusted so as to cancel therein the non-linear products generated in the transistor 12.

The phase opposition necessary to the subtraction of the error signal from the overall signal proceeding from the transistor 12 is achieved by the phase reversal of the transistor 20 connected in common-emitter mode; the additional phase-shift of this transistor in the upper portion of the transmitted band is compensated by a network having a phase advance of potentiometric type formed by the resistor 21 connected in parallel with the capacitor 22, acting in conjunction with the impedance presented by the coupler 9 between the point b3 and amplifier ground.

In order to obtain cancellation on the load of the non-linear products generated in the transistor 12 it is, in addition, necessary for the closed loop gain of the amplifier for the signals amplified by the cascade of transistors to be equal to the closed loop gain which the amplifier would have for the signals amplified by the cascade of transistors and the transistorised correction stage, if the inductance 19 were connected to ground instead of being connected to the base of the transistor 12. This equality in gain is obtained by suitable choice for the values of the resistors 13, 14, 15 and 150.

FIG. 2 shows a similar circuit diagram, which uses the same reference numbers 1 to 7, 10 to 12, 18, 80 and 90 as FIG. 1. The main difference with respect to the previous circuit diagram is that the feed-forward correction stage is associated here with the input stage, that is to say, with the transistor 10 with the aim of improving the noise factor of the amplifier. In the input coupler, referenced here as 8', the two resistors as in FIG. 1 are replaced by three resistors 24, 16' and 17'. This provides, on the amplifier side of the coupler, a first port a'1 (the point common to the resistors 16' and 24) to which the base of the transistor 10 is connected, a second port a'2 (the point common to the resistors 16' and 17') for the feed-back network 18, and a third port a'3 (the point common to the resistor 24 and to the winding on the amplifier side of the transformer 80) to which the correction stage is connected. The output coupler resistors, referenced here as 9', only includes two resistors 14' and 15' providing a first port b'1 (the point common to the resistor 14' and to the winding on the amplifier side of the transformer 90) to which the collector of the transistor 12 is connected and a second port b'2 (the point common to the resistors 14' and 15') for the feed-back network 18. The two couplers 8' and 9' also include two balancing resistors, 170' and 150' respectively, connected to amplifier ground.

The correction stage includes, as in the previous case, a transistor 20' having its emitter connected to amplifier ground in common-emitter mode, its base connected to an inductive phase-shift impedance 10' and an attenuation resistor 23' and its collector connection to a parallel connection of a resistor 21' and a capacitor 22'.

The inductive phase-shift impedance is here connected to the port a'3 of the input coupler and the attenuation resistor to the collector of the transistor 10; the parallel resistor-capacitor network is connected, preferably, via a resistor referenced by 30 in FIG. 2, to this same collector.

The operation of the circuit represented in FIG. 2 is fairly similar to that of the circuit shown in FIG. 1. A suitable choice of the values for the resistor 23' and for the inductive impedance 19' makes it possible to cancel, at the base of the transistor 20', the components of the wanted signals proceeding from the collector of the transistor 10 and from the port a'3 of the input coupler 8'. The result is that the error signal applied to the base of the correction transistor 20' is essentially due to the thermal noise signal contributed by the transistor 10, taking into account the overall negative feed-back applied by means of the coupler 8'. The error signal applied to the base of the correction transistor 20' is then led to the collector of the transistor 10 after phase reversal and amplification, so as to cancel, at this collector, the thermal noise signal created by the transistor 10.

The connection of the correction stage in parallel across the first transistor of the cascade of amplifiers enables the noise factor of the amplifier to be improved. In short, the noise signal created by the transistor 10 is thus compensated, taking into account the overall negative feed-back. The only noise signal which persists is what is inevitably contributed by the correction stage, but this latter signal is much weaker than the noise that is compensated because the signal-to-noise ratio at the port a'3 is better than that at the port a'1 and also because the transistor 20' only has to transmit a low-power signal and may therefore be biased at low current.

A third variant of the amplifier is shown in FIG. 3 where the same reference numerals 1 to 7, 10 to 12 and 18 are employed for parts which are identical with respect to the previous examples. We may observe that the couplers 8 and 9 of FIG. 1 are replaced here by couplers 8" and 9" respectively. These couplers 8" and 9" are each formed of a transformer equipped on its amplifier side with a plurality of windings enabling the resistors such as 13 to 17 to be dispensed with.

The coupler 8" includes, on its amplifier side, two windings 25 and 26 with a common terminal which forms a port a"2 for the feed-back network 18. The other terminal of the winding 25 forms a port a"1 to which the base of the transistor 10 is connected whilst the other terminal of the winding 26 is connected to the amplifier ground through a balancing resistor 170".

The coupler 9" includes, on its amplifier side, three windings 27, 28 and 29 and a balancing resistor 150" connected between the winding 29 and amplifier ground. The terminal common to the windings 28 and 29 forms a port b"2 for the feed-back network 18, the terminal common to the windings 28 and 27 form a port b"3 which is employed for the correction stage, whilst the other terminal of the winding 27 forms a port b"1 for the collector of the transistor 12.

The correction stage still comprises a transistor 20" connected in common emitter mode, an inductive phase-shift impedance 10", an attentuation resistor 23" and a parallel connector resistor 21" and capacitor 22". These components are connected together and connected to other components of the circuit in the same way as the components 20, 19, 23, and 21–22 of FIG. 1, except as far as the port to the output coupler is concerned, this port being this time interposed between the port employed for the collector of the transistor 12 and the port employed for the negative feed-back network 18. It will, however, be observed that this port interchange is optional and merely forms another special feature of the variant illustrated.

The operation of this variant is quite similar to that of the circuit as in FIG. 1.

It will be observed that it is not necessary to achieve perfect cancellation of the wanted signals at the base of the correction transistor 20, 20' or 20", the incidence of imperfect cancellation on the gain of the amplifier being reducing by the overall negative feed-back of the amplifier.

Although amplifiers in accordance with the invention can be clearly understood by one skilled in the art from the AC circuit diagrams according to FIGS. 1 to 3 a complete circuit diagram is shown in FIG. 4 for the amplifier of FIG. 1. In it one sees that the input and output couplers 8 and 9 are for high frequencies on coaxial lines. The reference numerals 8 to 23, 150 and 170 of FIG. 1 have been repeated, those components without reference numerals being provided in order to ensure either the separation of the feed current from the high-frequency signals or in order to effect so-called internal negative feed-back between two adjacent stages of the cascade in order to improve the stability of the amplifier. It is a mixed-negative-feed-back amplifier.

By way of example some preferred values are given below for the essential components of the feed forward branch of a wide-band amplifier having an upper transmitted frequency of 60 MHz.

| Reference No. | Nature | Value |
| --- | --- | --- |
| 13 | Resistor | 154Ω |
| 14 | Resistor | 165Ω |
| 15 | Resistor | 75Ω |
| 19 | Inductance + resistor | 0.43μH + 14.7Ω |
| 21 | Resistor | 2kΩ |
| 22 | Capacitor | 117pF |
| 23 | Resistor | 3.7kΩ |

All the other values may be calculated by one skilled in the art by well known conventional methods.

It is addition obvious that the invention is not restricted to the example of these values which depend upon the frquency band to be amplified, upon the total gain desired and upon tolerable factors of distortion from non-linearity and of noise.

Particular embodiments of the invention have been described but of course modifications may be applied to them and/or certain means may be replaced by others technically equivalent.

Furthermore it is quite obvious that without departing from the scope of the invention, the correction stage may be equipped with other components such as transistors provided that these do not introduce an additional phase-inversion overall.

I claim:

1. A wide-band transistorized amplifier including two line couplers interconnected by a cascade of amplification stages and a negative feed-back two port network connecting the output from the last stage of the cascade to the input to the first, and including a transistorized feed forward correction stage connected in parallel across one of the end stages of the cascade connected to one of the line couplers, wherein the cascade stage across which the correction stage is connected in parallel introduces a phase inversion, and wherein the correction stage includes a common-emitter connected transistor whose base is connected to the input to the said end stage of the cascade via an inductive phase-shift impedance and also to the output from the said end stage of the cascade via a resistor, the collector of said transistor of the correction stage being connected to one terminal of the output coupler via a parallel connected resistor and capacitor, so that the wanted signal is cancelled at the input to the transistor of the correction stage and so that the non-linear products generated by the last stage of the cascade, which constitute the only signal amplified by the correction stage, are cancelled at the level of a load connected to the output of the amplifier.

2. An amplifier according to claim 1, wherein the coupler to which the correction stage is connected includes, on its amplifier side, one more port than does the other coupler so that the correction stage and the amplification stage of the cascade, across which the correction stage is connected in parallel are connected to two different ports of the coupler concerned.

3. An amplifier according to claim 1 or 2, wherein the said correction stage is connected in parallel across the last stage of the cascade.

* * * * *